(12) United States Patent
Miyajima et al.

(10) Patent No.: US 7,001,820 B1
(45) Date of Patent: Feb. 21, 2006

(54) HETEROJUNCTION BIPOLAR TRANSISTOR AND METHOD FOR FABRICATING THE SAME

(75) Inventors: Kenichi Miyajima, Toyama (JP); Akiyoshi Tamura, Osaka (JP); Keiichi Murayama, Toyama (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 11/066,220

(22) Filed: Feb. 28, 2005

(30) Foreign Application Priority Data

Mar. 8, 2004 (JP) .............................. 2004-064450

(51) Int. Cl.
*H01L 21/331* (2006.01)
(52) U.S. Cl. .................. 438/312; 438/172; 438/189
(58) Field of Classification Search ............... 438/170, 438/172, 189, 202, 309–327
See application file for complete search history.

(56) References Cited

U.S. PATENT DOCUMENTS 6,403,436 B1 * 6/2002 Tanomura .................. 438/312

FOREIGN PATENT DOCUMENTS

JP 2001-308103 A 11/2001

* cited by examiner

*Primary Examiner*—David Nelms
*Assistant Examiner*—Quoc Hoang
(74) *Attorney, Agent, or Firm*—McDermott Will & Emery LLP (57) ABSTRACT

The following layers are successively formed on a heavily-doped n-type first subcollector layer: a heavily-doped n-type second subcollector layer made of a material having a small band gap; an i-type or a lightly-doped n-type collector layer; a heavily-doped p-type base layer; an n-type emitter layer made of a material having a large band gap; a heavily-doped n-type emitter cap layer; and a heavily-doped n-type emitter contact layer made of a material having a small band gap. Alloying reaction layers are formed under an emitter electrode, a base electrode and a collector electrode.

10 Claims, 8 Drawing Sheets

HETEROJUNCTION BIPOLAR TRANSISTOR AND METHOD FOR FABRICATING THE SAME

CROSS-REFERENCE TO RELATED APPLICATIONS

This application claims priority under 35 U.S.C. § 119 on Patent Application No. 2004-064450 filed in Japan on Mar. 8, 2004, the entire contents of which are hereby incorporated by reference.

BACKGROUND OF THE INVENTION (1) Field of the Invention

The present invention relates to a heterojunction bipolar transistor that has been widely used for a high power amplifier for transmission or the like and a method for fabricating the same.

(2) Description of Related Art

In recent years, with increase in functionality and communication capacity of cellular phones, higher performance has been demanded also for high-frequency analog elements used for cellular phones. Heterojunction bipolar transistors (hereinafter, referred to as "HBT") out of the high-frequency analog elements have already been brought into actual use as high power amplifiers. In order to improve the performance of HBTs, the parasitic element effects need be reduced, i.e., parasitic resistances and parasitic capacitances need be reduced. The parasitic resistances are broadly grouped into an emitter resistance, a base resistance and a collector resistance. In order to reduce the contact resistance, HBTs have been suggested which use alloying reaction layers for ohmic electrodes.

The structure of a known HBT using alloying reaction layers for ohmic electrodes and a method for fabricating the same (see, for example, Japanese Unexamined Patent Publication No. 2001-308103) will be described hereinafter with reference to FIG. 7.

Figure 7:
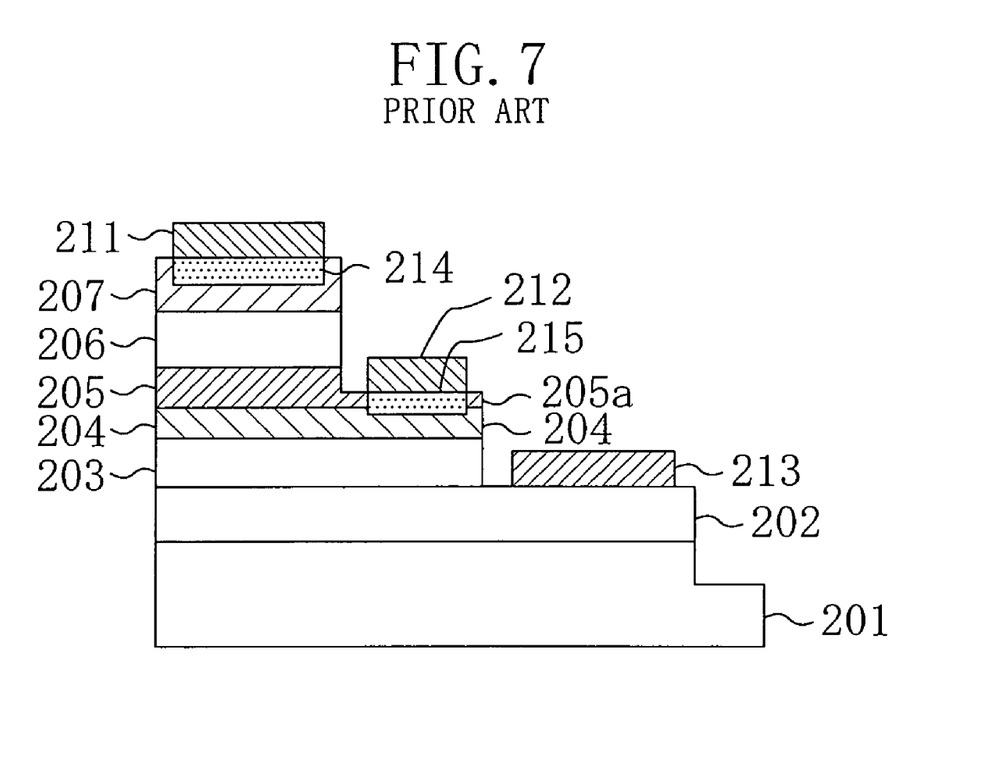
FIG. 7 is a cross-sectional view showing the structure of a known HBT.

FIG. 7 is a schematic cross-sectional view showing the structure of the known HBT using alloying reaction layers for ohmic electrodes. As shown in FIG. 7, a subcollector layer 202 made of a heavily-doped n-type GaAs layer is formed on a semi-insulating substrate 201 of GaAs. A collector layer 203 made of a lightly-doped n-type GaAs layer, a base layer 204 made of a heavily-doped p-type GaAs layer and an emitter layer 205 made of an n-type AlGaAs layer are successively formed on a region of the subcollector layer 202 on which a collector is formed (hereinafter, referred to as "collector formation region"). In this relation, a predetermined part of the emitter layer 205 has a smaller thickness than the other part thereof and will be a base protection layer 205a. An emitter cap layer 206 made of a heavily-doped n-type GaAs layer and an emitter contact layer 207 made of a heavily-doped n-type InGaAs layer are successively formed on a region of the emitter layer 205 other than the part thereof that constitutes the base protection layer 205a.

As shown in FIG. 7, an emitter electrode 211 with a Pt/Ti/Pt/Au structure (in which a Pt layer, a Ti layer, a Pt layer, and an Au layer are stacked in bottom-to-top order) is formed on the emitter contact layer 207. A base electrode 212 with a Pt/Ti/Pt/Au structure is formed on the base protection layer 205a made of an n-type AlGaAs layer. A collector electrode 213 with an AuGe/Ni/Au structure (in which an AuGe layer, a Ni layer and an Au layer are stacked in bottom-to-top order) is formed on a region of the subcollector layer 202 other than the collector formation region.

As shown in FIG. 7, a first Pt alloying reaction layer 214 is formed in a part of the emitter contact layer 207 located under the emitter electrode 211, and a second Pt alloying reaction layer 215 is formed in a part of the base protection layer 205a located under the base electrode 212. The first Pt alloying reaction layer 214 and the second Pt alloying reaction layer 215 are formed by heat treatment for reacting an electrode material (specifically, Pt constituting the lowest layer of each electrode) with a semiconductor material. The second Pt alloying reaction layer 215 passes through the base protection layer 205a and reaches the upper part of the base layer 204.

For the known HBT shown in FIG. 7, the provision of the base protection layer 205a prevents the recombination of carriers at the surface of the base layer 204. Thus, the current amplification factor is restrained from being reduced. On the other hand, since the base protection layer 205a covers the surface of the base layer 204, the base electrode 212 cannot be brought into direct contact with the base layer 204. To cope with this, the second Pt alloying reaction layer 215 is formed under the base electrode 212 by heat treatment to pass through the base protection layer 205a, thereby connecting the base electrode 212 through the second Pt alloying reaction layer 215 to the base layer 204. As a result, ohmic contact is obtained. On the other hand, the first Pt alloying reaction layer 214 located under the emitter electrode 211 is formed only inside the emitter contact layer 207.

As can be seen from the above, for the known HBT, the formation of the Pt alloying reaction layers 214 and 215 permits reduction in the widths of potential barriers at the junctions between the emitter contact layer 207 and the first Pt alloying reaction layer 214 and between the base layer 204 and the second Pt alloying reaction layer 215. This allows the tunnel effect of carriers to provide excellent ohmic characteristics. Therefore, the emitter contact resistance and the base contact resistance can be reduced, leading to reduced emitter resistance and base resistance.

SUMMARY OF THE INVENTION

However, the known HBT shown in FIG. 7 has the following problems. The reason for this is that while the emitter electrode 211 and the base electrode 212 each have a Pt/Ti/Pt/Au structure, the collector electrode 213 has an AuGe/Ni/Au structure.

More particularly, all of the emitter electrode 211, the base electrode 212 and the collector electrode 213 cannot be formed at the same time. In other words, the step of forming the emitter electrode 211 and the base electrode 212 at the same time and the step of forming the collector electrode 213 must be carried out separately. To be specific, in the step of forming each electrode, the following sub-steps need be carried out: the sub-step of forming a photo resist having a pattern equivalent to an electrode shape; the sub-step of forming a metal thin film by evaporation and sputtering; and a lift-off sub-step in which the photo resist is removed to leave only a necessary part of the metal thin film. Therefore, for the known HBT, production cost increases with increase in the number of the HBT fabricating process steps.

Figure 8A:
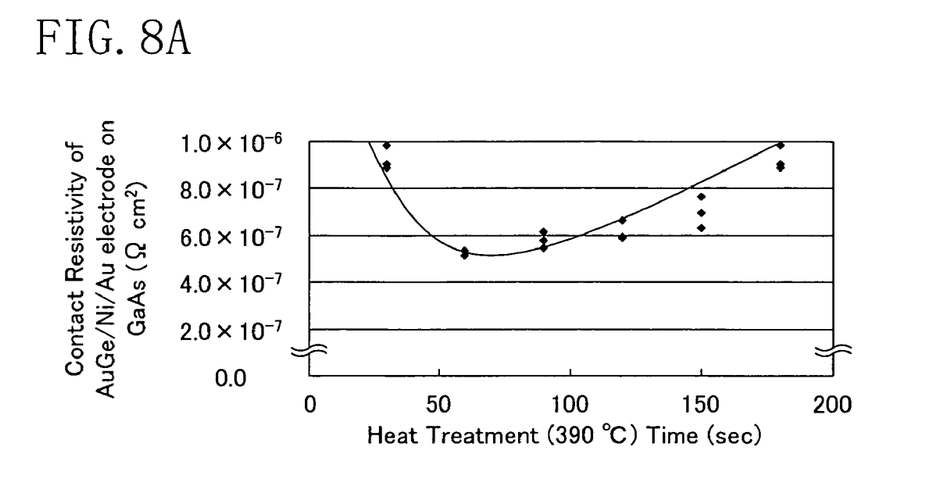
FIGS. 8A and 8B are graphs showing respective heat treatment time dependences of contact resistivities of electrodes when their metals make contact with semiconductors.
Figure 8B:
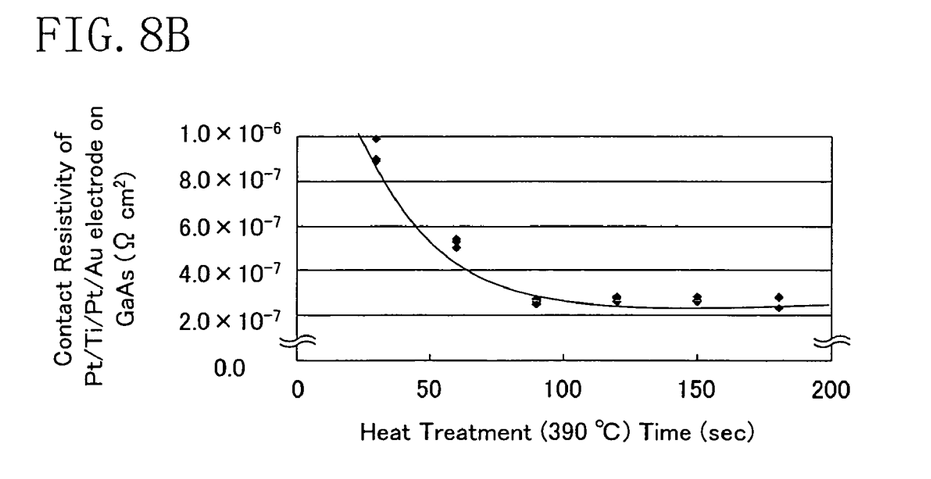

Furthermore, for the known HBT, optimum heat treatment conditions for the emitter electrode 211 and the base electrode 212 each with a Pt/Ti/Pt/Au structure are different from those for the collector electrode 213 with an AuGe/Ni/Au structure. This will be described specifically with reference to the drawings. FIG. 8A shows the dependence of contact resistivity of an electrode formed on GaAs and having an AuGe/Ni/Au structure on time of heat treatment at 390° C. FIG. 8B shows the dependence of contact resistivity of an electrode formed on GaAs and having a Pt/Ti/Pt/Au structure on the heat treatment time at 390° C. As shown in FIGS. 8A and 8B, while the contact resistivity of the AuGe/Ni/Au electrode on GaAs gradually increases after 60 seconds, the contact resistivity of the Pt/Ti/Pt/Au electrode on GaAs is too large within 90 seconds to provide sufficient ohmic characteristics. Accordingly, if the heat treatment conditions for each electrode are adapted to the optimum heat treatment conditions for the emitter electrode 211 and the base electrode 212 each with a Pt/Ti/Pt/Au structure, the collector electrode 213 with an AuGe/Ni/Au structure is deteriorated in its ohmic characteristics. On the other hand, if the heat treatment conditions for each electrode are adapted to the optimum heat treatment conditions for the collector electrode 213, the emitter electrode 211 and the base electrode 212 cannot provide sufficient ohmic characteristics.

In view of the above, it is an object of the present invention to provide a HBT that can reduce production cost and allows all electrodes to provide excellent contact characteristics.

In order to achieve the above object, a HBT according to a first aspect of the present invention comprises: a heavily-doped n-type first subcollector layer; a heavily-doped n-type second subcollector layer formed on the first subcollector layer and made of a material having a smaller band gap than the first subcollector layer; an i-type or lightly-doped n-type collector layer formed on a predetermined part of the second subcollector layer; a heavily-doped p-type base layer formed on the collector layer; an n-type emitter layer formed on the base layer and made of a material having a larger band gap than the base layer; a heavily-doped n-type emitter cap layer formed on a predetermined part of the emitter layer; a heavily-doped n-type emitter contact layer formed on the emitter cap layer and made of a material having a smaller band gap than the emitter cap layer; an emitter electrode formed on the emitter contact layer and made of one or a plurality of conductive layers; a base electrode formed on a part of the emitter layer on which the emitter cap layer is not formed and made of one or a plurality of conductive layers; and a collector electrode formed on a part of the second subcollector layer on which the collector layer is not formed and made of one or a plurality of conductive layers, wherein a first alloying reaction layer is formed in a part of the emitter contact layer located under the emitter electrode, a second alloying reaction layer is formed in a part of the emitter layer located under the base electrode, and a third alloying reaction layer is formed in a part of the second subcollector layer located under the collector electrode.

A heterojunction bipolar transistor according to a second aspect of the present invention comprises: a heavily-doped n-type first subcollector layer; a heavily-doped n-type second subcollector layer formed on the first subcollector layer and made of a material having a smaller band gap than the first subcollector layer; an i-type or lightly-doped n-type collector layer formed on a predetermined part of e second subcollector layer; a heavily-doped p-type base layer formed on the collector layer; an n-type emitter layer formed on a predetermined part of the base layer and made of a material having a larger band gap than the base layer; a heavily-doped n-type emitter cap layer formed on the emitter layer; a heavily-doped n-type emitter contact layer formed on the emitter cap layer and made of a material having a smaller band gap than the emitter cap layer; an emitter electrode formed on the emitter contact layer and made of one or a plurality of conductive layers; a base electrode formed on a part of the base layer on which the emitter layer is not formed and made of one or a plurality of conductive layers; and a collector electrode formed on a part of the second subcollector layer on which the collector layer is not formed and made of one or a plurality of conductive layers, wherein a first alloying reaction layer is formed in a part of the emitter contact layer located under the emitter electrode, a second alloying reaction layer is formed in a part of the base layer located under the base electrode, and a third alloying reaction layer is formed in a part of the second subcollector layer located under the collector electrode.

A method for fabricating a heterojunction bipolar transistor according to the first aspect of the present invention comprises the steps of: successively forming, on the principal surface of a semi-insulating substrate, a heavily-doped n-type first subcollector layer, a heavily-doped n-type second subcollector layer made of a material having a smaller band gap than the first subcollector layer, an i-type or a lightly-doped n-type collector-layer-forming film, a heavily-doped p-type base-layer-forming film, an n-type emitter-layer-forming film made of a material having a larger band gap than the base-layer-forming film, a heavily-doped n-type emitter-cap-layer-forming film, and a heavily-doped n-type emitter-contact-layer-forming film made of a material having a smaller band gap than the emitter-cap-layer-forming film; patterning the emitter-contact-layer-forming film and the emitter-cap-layer-forming film to expose a base electrode formation region of the emitter-layer-forming film, thereby forming an emitter contact layer and an emitter cap layer; patterning the emitter-layer-forming film, the base-layer-forming film and the collector-layer-forming film to expose a collector electrode formation region of the second subcollector layer, thereby forming an emitter layer, a base layer and a collector layer; forming an emitter electrode made of one or a plurality of conductive layers on an emitter electrode formation region of the emitter contact layer; forming a base electrode made of one or a plurality of conductive layers on the base electrode formation region of the emitter layer; forming a collector electrode made of one or a plurality of conductive layers on the collector electrode formation region of the second subcollector layer; and forming, by heat treatment, a first alloying reaction layer, a second alloying reaction layer and a third alloying reaction layer in a part of the emitter contact layer located under the emitter electrode, a part of the emitter layer located under the base electrode and a part of the second subcollector layer located under the collector electrode, respectively.

A method for fabricating a heterojunction bipolar transistor according to the second aspect of the present invention comprises the steps of: successively forming, on the principal surface of a semi-insulating substrate, a heavily-doped n-type first subcollector layer, a heavily-doped n-type second subcollector layer made of a material having a smaller band gap than the first subcollector layer, an i-type or a lightly-doped n-type collector-layer-forming film, a heavily-doped p-type base-layer-forming film, an n-type emitter-layer-forming film made of a material having a larger band gap than the base-layer-forming film, a heavily-doped n-type emitter-cap-layer-forming film, and a heavily-doped n-type emitter-contact-layer-forming film made of a material having a smaller band gap than the emitter-cap-layer-forming film; patterning the emitter-contact-layer-forming film and the emitter-cap-layer-forming film to expose a base electrode formation region of the emitter-layer-forming film, thereby forming an emitter contact layer and an emitter cap layer; patterning the emitter-layer-forming film, the base-layer-forming film and the collector-layer-forming film to expose a collector electrode formation region of the second subcollector layer, thereby forming an emitter layer, a base layer and a collector layer; forming an emitter electrode made of one or a plurality of conductive layers on an emitter electrode formation region of the emitter contact layer; forming a base electrode made of one or a plurality of conductive layers on the base electrode formation region of the emitter layer; forming a collector electrode made of one or a plurality of conductive layers on the collector electrode formation region of the second subcollector layer; and forming, by heat treatment, a first alloying reaction layer, a second alloying reaction layer and a third alloying reaction layer in a part of the emitter contact layer located under the emitter electrode, a part of the emitter layer located under the base electrode and a part of the second subcollector layer located under the collector electrode, respectively.

Herein, the heavily-doped layers mean layers having an impurity concentration of $1 \times 10^{18}$ cm$^{-3}$ or more and the lightly-doped layers mean layers having an impurity concentration of $1 \times 10^{17}$ cm$^{-3}$ or less.

According to the present invention, heavily-doped n-type semiconductors each made of a material having a small band gap are used for the emitter contact layer and the second subcollector layer. Therefore, ohmic connection between the emitter contact layer and a metal constituting the emitter electrode formed thereon can easily be achieved, and ohmic connection between the second subcollector layer and a metal constituting the collector electrode formed thereon can easily be achieved. In view of the above, the same material as that of the base electrode can be used as a material of each of the emitter electrode and the collector electrode, and thus the electrodes can be formed simultaneously. Therefore, the number of fabrication process steps can be reduced, leading to the reduced production cost.

According to the present invention, the emitter electrode, the base electrode and the collector electrode are all made of the same material. In other words, each electrode has the same single layer structure or the same multilayer structure. Therefore, the same optimum heat treatment conditions can be set to form an alloying reaction layer under each electrode. To be specific, the optimum heat treatment conditions for forming the first alloying reaction layer under the emitter electrode, the optimum heat treatment conditions for forming the second alloying reaction layer under the base electrode, and the optimum heat treatment conditions for forming the third alloying reaction layer under the collector electrode can be made equivalent to one another. Thus, excellent ohmic contact can be obtained for each electrode.

In view of the above, the present invention relates to a HBT and a method for fabricating the same and is useful in the following point. When the present invention is applied to a HBT using alloying reaction layers for ohmic electrodes, production cost can be reduced and excellent contact characteristics can be realized for each electrode.

DETAILED DESCRIPTION OF THE INVENTION

Embodiment 1

A HBT according to this embodiment and a method for fabricating the same will be described hereinafter with reference to the drawings.

Figure 1:
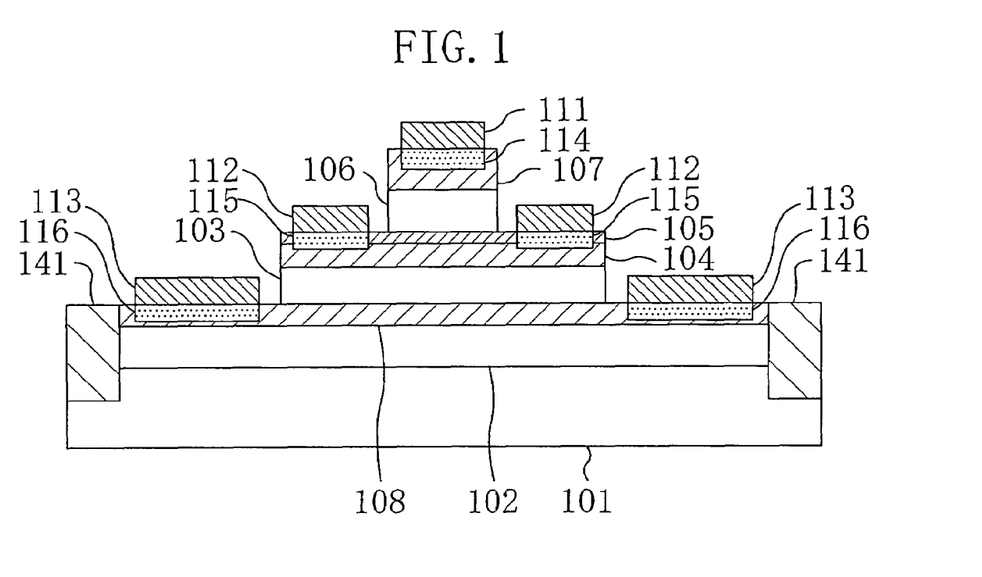
FIG. 1 is a cross-sectional view showing the structure of a HBT according to a first embodiment of the present invention.

FIG. 1 is a cross-sectional view showing the structure of the HBT according to this embodiment.

As shown in FIG. 1, a 600-nm-thick first subcollector layer 102, for example, doped with n-type impurities at a high concentration of $5 \times 10^{18}$ cm$^{-3}$ and made of an n-type GaAs layer is formed, for example, on a semi-insulating substrate 101 of GaAs. A 100-nm-thick second subcollector layer 108, for example, doped with n-type impurities at a high concentration of $1 \times 10^{19}$ cm$^{-3}$ and made of an n-type InGaAs layer is formed on the first subcollector layer 101. InGaAs constituting the second subcollector layer 108 has a smaller band gap than GaAs constituting the first subcollector layer 102.

The following layers are successively stacked on a predetermined part of the second subcollector layer 108: a 500-nm-thick collector layer 103, for example, doped with n-type impurities at a low concentration of $1 \times 10^{16}$ cm$^{-3}$ and made of an n-type GaAs layer; a 100-nm-thick base layer 104, for example, doped with p-type impurities at a high concentration of $4 \times 10^{19}$ cm$^{-3}$ and made of a p-type GaAs layer; and a 30-nm-thick emitter layer 105, for example, doped with n-type impurities at a concentration of $3 \times 10^{17}$ cm$^{-3}$ and made of an n-type InGaP (specifically, In$_{0.48}$Ga$_{0.52}$P having an In content of about 48%) layer. A multilayer structure of the collector layer 103, the base layer 104 and the emitter layer 105 is formed on the predetermined part of the second subcollector layer 108 to have a convex shape. An i-type GaAs layer may be used as the collector layer 103. In$_{0.48}$Ga$_{0.52}$P constituting the emitter layer 105 has a larger band gap than GaAs constituting the base layer 104.

A 200-nm-thick emitter cap layer 106, for example, doped with n-type impurities at a high concentration of $3 \times 10^{18}$ cm$^{-3}$ and made of an n-type GaAs layer and a 100-nm-thick emitter contact layer 107, for example, doped with n-type impurities at a high concentration of $1 \times 10^{19}$ cm$^{-3}$ and made of a 100-nm-thick n-type InGaAs layer are successively stacked on a predetermined part of the emitter layer 105. In other words, the emitter cap layer 106 and the emitter contact layer 107 are successively formed on the predetermined part of the emitter layer 105 to have a convex shape. InGaAs constituting the emitter contact layer 107 has a smaller band gap than GaAs constituting the emitter cap layer 106.

An emitter electrode 111, for example, having a Pt/Ti/Pt/Au structure is formed on the emitter contact layer 107. A base electrode 112, for example, having a Pt/Ti/Pt/Au structure is formed on an exposed part of the emitter layer 105 on which the emitter cap layer 106 is not formed. A collector electrode 113, for example, having a Pt/Ti/Pt/Au structure is formed on an exposed part of the second subcollector layer 108 on which the collector layer 103 is not formed.

A first Pt alloying reaction layer 114 is formed in a part of the emitter contact layer 107 located under the emitter electrode 111. In this relation, the first Pt alloying reaction layer 114 is formed by heat treatment for reacting Pt constituting the lowest layer of the emitter electrode 111 with InGaAs constituting the emitter contact layer 107. In addition, the first Pt alloying reaction layer 114 is formed only inside the emitter contact layer 107.

A second Pt alloying reaction layer 115 is formed in a part of the emitter layer 105 located under the base electrode 112. In this relation, the second Pt alloying reaction layer 115 is formed by heat treatment for reacting Pt constituting the lowest layer of the base electrode 112 with InGaP constituting the emitter layer 105. In addition, the second Pt alloying reaction layer 115 is formed to pass through the emitter layer 105 and reach the base layer 104. This allows the base electrode 112 to be connected through the second Pt alloying reaction layer 115 to the base layer 104. As a result, ohmic contact can certainly be obtained.

A third Pt alloying reaction layer 116 is formed in a part of the second subcollector layer 108 located under the collector electrode 113. In this relation, the third Pt alloying reaction layer 116 is formed by heat treatment for reacting Pt constituting the lowest layer of the collector electrode 113 with InGaAs constituting the second subcollector layer 108. In addition, the third Pt alloying reaction layer 116 is formed only inside the second subcollector layer 108.

In this embodiment, in order to electrically isolate HBTs from one another, an isolation region 141 is formed around a region where each HBT is formed (hereinafter, referred to as "HBT formation region") to pass through a multilayer structure of the second subcollector layer 108 and the first subcollector 102 and reach the substrate 101.

A method for fabricating a HBT of this embodiment as shown in FIG. 1 will be described hereinafter with reference to the drawings.

FIGS. 2A through 2C, 3A, and 3B are cross-sectional views showing process steps of the method for fabricating a HBT of this embodiment.

Figure 2A:
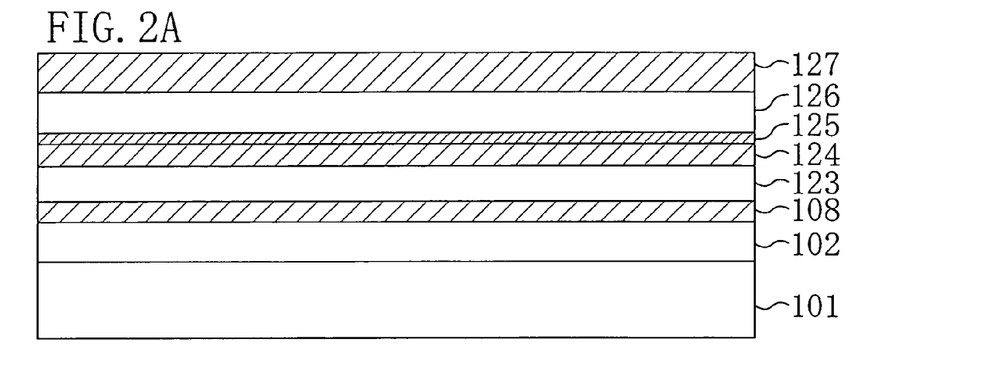
FIGS. 2A through 2C are cross-sectional views showing some of process steps of a method for fabricating a HBT according to the first embodiment of the present invention.

First, as shown in FIG. 2A, the following layers are successively formed on a semi-insulating substrate 101, for example, made of GaAs by crystal growth, such as molecular beam epitaxy (MBE) or metal organic chemical vapor deposition (MOCVD): a 600-nm-thick first subcollector layer 102, for example, doped with n-type impurities at a high concentration of $5\times10^{18}$ cm$^{-3}$ and made of an n-type GaAs layer; a 100-nm-thick second subcollector layer 108, for example, doped with n-type impurities at a high concentration of $1\times10^{19}$ cm$^{-3}$ and made of an n-type InGaAs layer; a 500-nm-thick collector-layer-forming film 123, for example, doped with n-type impurities at a low concentration of $1\times10^{16}$ cm$^{-3}$ and made of an n-type GaAs layer; a 100-nm-thick base-layer-forming film 124, for example, doped with p-type impurities at a high concentration of $4\times10^{19}$ cm$^{-3}$ and made of a p-type GaAs layer; a 30-nm-thick emitter-layer-forming film 125, for example, doped with n-type impurities at a concentration of $3\times10^{17}$ cm$^{-3}$ and made of an n-type InGaP (specifically, $In_{0.48}Ga_{0.52}P$ having an In content of about 48%) layer; a 200-nm-thick emitter-cap-layer-forming film 126, for example, doped with n-type impurities at a high concentration of $3\times10^{18}$ cm$^{-3}$ and made of an n-type GaAs layer; and a 100-nm-thick emitter-contact-layer-forming film 127, for example, doped with n-type impurities at a high concentration of $1\times10^{19}$ cm$^{-3}$ and made of an n-type InGaAs layer. An i-type GaAs layer may be formed as the collector-layer-forming film 123. Furthermore, $In_{0.48}Ga_{0.52}P$ constituting the emitter-layer-forming film 125 has a larger band gap than GaAs constituting the base-layer-forming film 124. InGaAs constituting the emitter-contact-layer-forming film 127 has a smaller band gap than GaAs constituting the emitter-cap-layer-forming film 126.

Figure 2B:
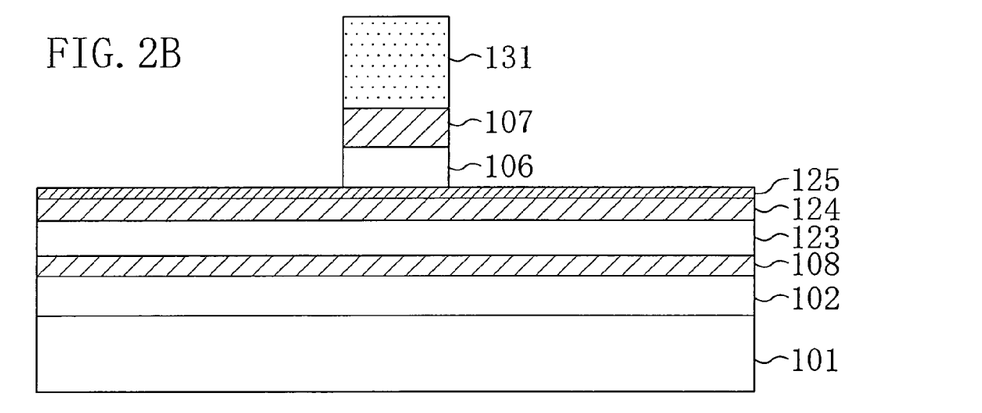

Next, as shown in FIG. 2B, the emitter-contact-layer-forming film 127 and the emitter-cap-layer-forming film 126 are successively etched, for example, by a phosphate etching solution, using, as a mask, a photo resist pattern 131 for protecting a region where an emitter is formed (hereinafter, referred to as "emitter formation region"). In this way, an emitter island region is formed to have a multilayer structure of an emitter cap layer 106 and an emitter contact layer 107. In addition, a region of the emitter-layer-forming film 125 on which a base electrode is formed (hereinafter, referred to "base electrode formation region") is exposed. In this case, the emitter-layer-forming film 125 of $In_{0.48}Ga_{0.52}P$ is hardly etched.

Figure 2C:
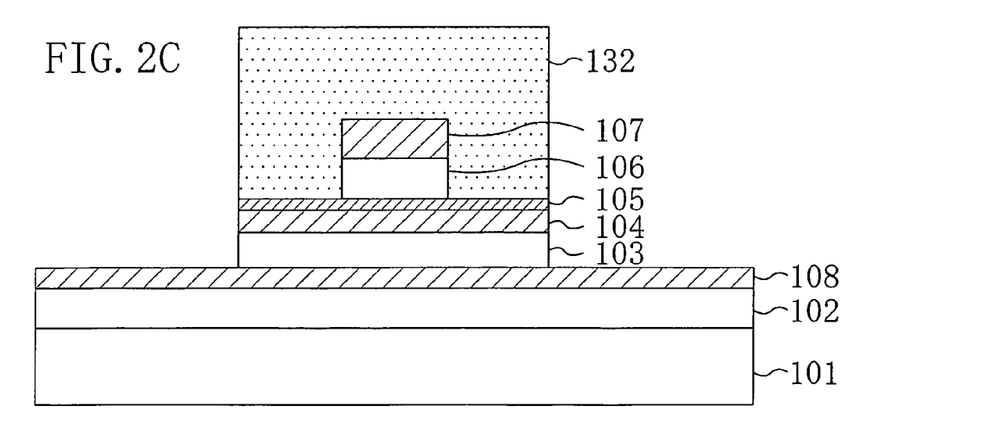

Next, as shown in FIG. 2C, the emitter-layer-forming film 125 is selectively etched, for example, by hydrochloric acid diluted with water, using, as a mask, a photo resist pattern 132 for protecting a region where a base is formed (hereinafter, referred to "base formation region") including the emitter formation region. Subsequently, the base-layer-forming film 124 and the collector-layer-forming film 123 are successively etched, for example, by a citrate etching solution, using the patterned emitter-layer-forming film 125, i.e., an emitter layer 105, as a mask. In this way, a base island region is formed to have a multilayer structure of a collector layer 103, a base layer 104 and an emitter layer 105. In addition, a region of the second subcollector layer 108 on which a collector electrode is formed (hereinafter, referred to as "collector electrode formation region") is exposed. In this case, the second subcollector layer 108 of InGaAs is hardly etched. In this embodiment, the second subcollector layer 108 made of an InGaAs layer functions as an etching stopper layer for wet etching using a citrate etching solution. Therefore, as compared with the known art, etching accuracy can sharply be improved in forming the base island region.

Figure 3A:
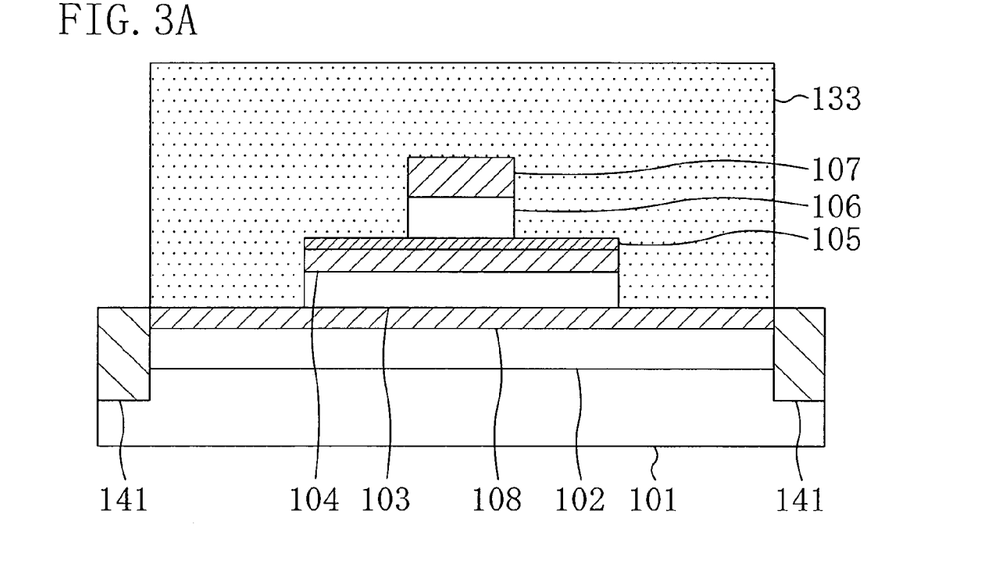
FIGS. 3A and 3B are cross-sectional views showing some of process steps of a method for fabricating a HBT according to the first embodiment of the present invention.

Next, as shown in FIG. 3A, for example, helium (He) ions are implanted into the second subcollector layer 108 and the first subcollector layer 102 using, as a mask, a photo resist pattern 133 for protecting each of unit HBT cells (individual HBT formation regions), thereby forming an isolation region 141. In this way, the unit HBT cells are isolated from one another.

Figure 3B:
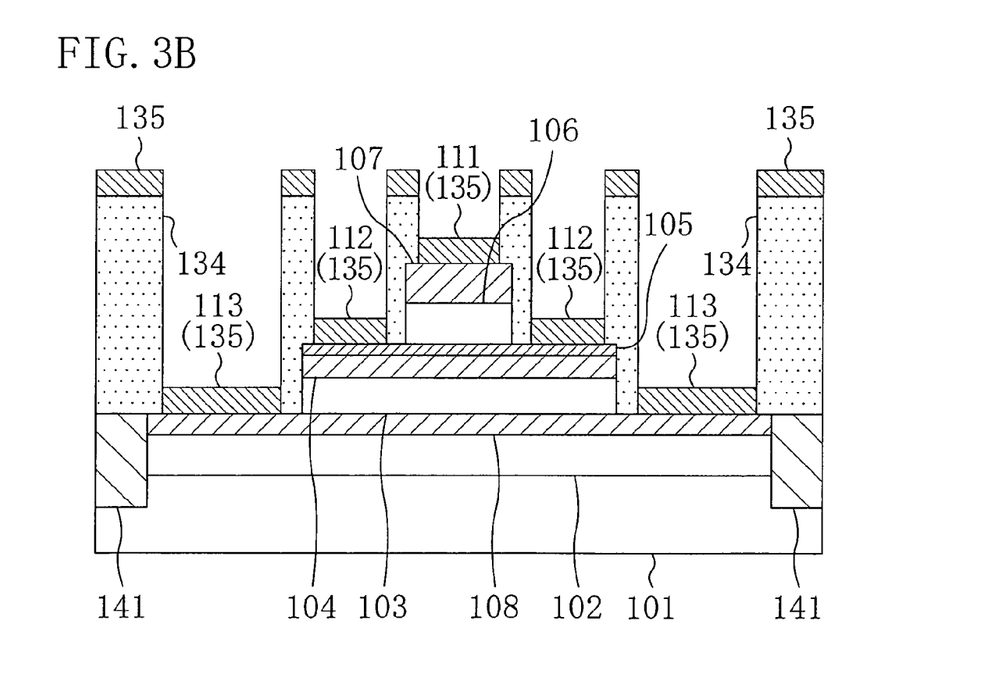

Next, as shown in FIG. 3B, a photo resist pattern 134 for forming electrodes, more specifically, the photo resist pattern 134 is formed to have openings on a region on which an emitter electrode is formed (hereinafter, referred to as "emitter electrode formation region"), a region on which a base electrode is formed (hereinafter, referred to as "base electrode formation region") and a region on which a collector electrode is formed (hereinafter, referred to as "collector electrode formation region"). Thereafter, an electrode-forming film 135, for example, having a Pt/Ti/Pt/Au structure (more specifically, the structure in which a 30-nm-thick Pt film, a 100-nm-thick Ti film, a 50-nm-thick Pt film, and a 50-nm-thick Au film are successively stacked) is formed on the entire surface region of the substrate, for example, by evaporation. Then, for example, the use of a lift-off technique allows unnecessary parts of the electrode-forming film 135 to peel off together with the photo resist pattern 134. In this way, an emitter electrode 111 is formed on the emitter electrode formation region of the emitter contact layer 107, a base electrode 112 is formed on the base electrode formation region of the emitter layer 105, and a collector electrode 113 is formed on the collector electrode formation region of the second subcollector layer 108. In other words, in this embodiment, the emitter electrode 111, the base electrode 112 and the collector electrode 113 are formed at the same time.

Finally, in order to complete the HBT of this embodiment shown in FIG. 1, for example, heat treatment at 390° C. for 120 seconds allows a metal (more specifically, Pt) constituting each electrode to react with a component of a semiconductor layer under each electrode. In this way, a first Pt alloying reaction layer 114 is formed in a part of the emitter contact layer 107 located under the emitter electrode 111, a second Pt alloying reaction layer 115 is formed in a part of the emitter layer 105 located under the base electrode 112, and a third Pt alloying reaction layer 116 is formed in a part of the second subcollector layer 108 located under the collector layer 113. The first Pt alloying reaction layer 114 is formed only inside the emitter contact layer 107, the second Pt alloying reaction layer 115 is formed to pass through the emitter layer 105 and reach the base layer 104, and the third Pt alloying reaction layer 116 is formed only inside the second subcollector layer 108. Furthermore, in this embodiment, the heat treatment is performed for the purpose of forming the Pt alloying reaction layers 114 through 116 and simultaneously inactivating the isolation region (formed by ion implantation) 141 to electrically isolate the unit HBT cells from one another. As a result, the number of fabrication process steps is reduced.

As described above, in this embodiment, heavily-doped n-type semiconductors made of a material having a small band gap are used for the emitter contact layer 107 and the second subcollector layer 108. Therefore, ohmic connection between the emitter contact layer 107 and a metal constituting the emitter electrode 111 formed thereon can easily be realized, and ohmic contact between the second subcollector layer 108 and a metal constituting the collector electrode 113 formed thereon can also easily be realized. Therefore, the same material as that of the base electrode 112 can be used as a material of each of the emitter electrode 111 and the collector electrode 113, and thus the electrodes 111 through 113 can be formed at the same time. This can reduce the number of fabrication process steps, leading to the reduced production cost.

According to this embodiment, the emitter electrode 111, the base electrode 112 and the collector electrode 113 are all made of the same material. In other words, the electrodes 111 through 113 each have the same metal multilayer structure. Therefore, the same optimum heat treatment conditions can be set to form the alloying reaction layers 114 through 116 under the electrode 111 through 113, respectively. To be specific, the following optimum heat treatment conditions are made equivalent to one another: the optimum heat treatment conditions for forming the first alloying reaction layer 114 under the emitter electrode 111; the optimum heat treatment conditions for forming the second alloying reaction layer 115 under the base electrode 112; and the optimum heat treatment conditions for forming the third alloying reaction layer 116 under the collector electrode 113. Hence, all the electrodes 111 through 113 can provide excellent ohmic contact.

Embodiment 2

A HBT according to a second embodiment of the present invention and a method for fabricating the same will be described hereinafter with reference to the drawings. The HBT of this embodiment is different from that of the first embodiment in the following point. While in the first embodiment the base electrode 112 is formed on the base layer 104 with the emitter layer 105 interposed therebetween, a base electrode 112 is formed directly on a base layer 104.

Figure 4:
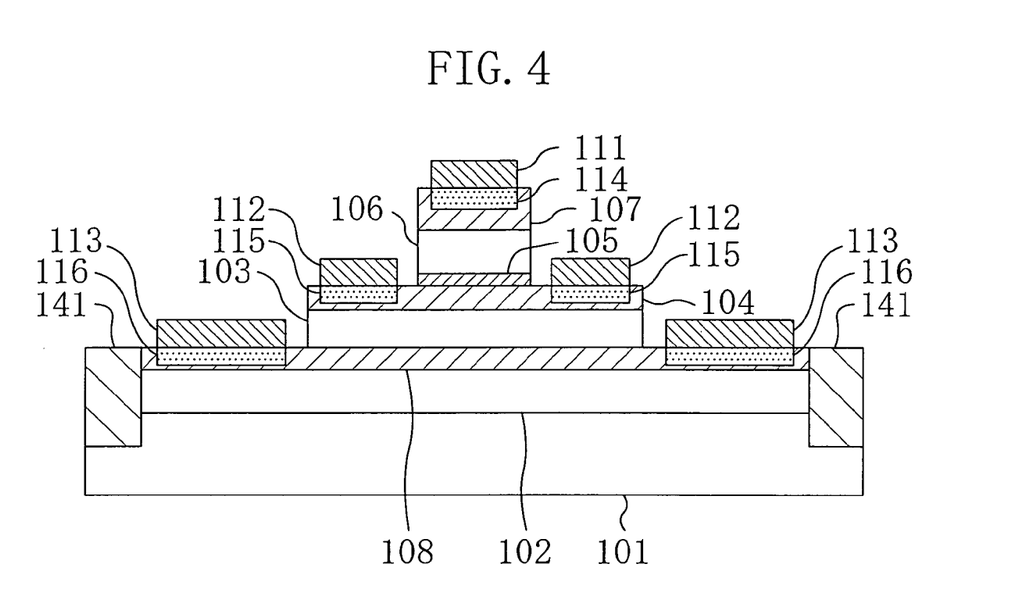
FIG. 4 is a cross-sectional view showing the structure of a HBT according to a second embodiment of the present invention.

FIG. 4 is a cross-sectional view showing the structure of the HBT according to this embodiment.

As shown in FIG. 4, a 600-nm-thick first subcollector layer 102, for example, doped with n-type impurities at a high concentration of $5 \times 10^{18}$ cm$^{-3}$ and made of an n-type GaAs layer is formed, for example, on a semi-insulating substrate 101 of GaAs. A 100-nm-thick second subcollector layer 108, for example, doped with n-type impurities at a high concentration of $1 \times 10^{19}$ cm$^{-3}$ and made of an n-type InGaAs layer is formed on the first subcollector layer 101. InGaAs constituting the second subcollector layer 108 has a smaller band gap than GaAs constituting the first subcollector layer 102.

A 500-nm-thick collector layer 103, for example, doped with n-type impurities at a low concentration of $1 \times 10^{16}$ cm$^{-3}$ and made of an n-type GaAs layer and a 100-nm-thick base layer 104, for example, doped with p-type impurities at a high concentration of $4 \times 10^{19}$ cm$^{-3}$ and made of a p-type GaAs layer are successively stacked on a predetermined part of the second subcollector layer 108. A multilayer structure of the collector layer 103 and the base layer 104 is formed on the predetermined part of the second subcollector layer 108 to have a convex shape. An i-type GaAs layer may be used as the collector layer 103.

The following layers are successively stacked on a predetermined part of the base layer 104: a 30-nm-thick emitter layer 105, for example, doped with n-type impurities at a concentration of $3 \times 10^{17}$ cm$^{-3}$ and made of an n-type InGaP (specifically, In$_{0.48}$Ga$_{0.52}$P having an In content of about 48%) layer; a 200-nm-thick emitter cap layer 106, for example, doped with n-type impurities at a high concentration of $3 \times 10^{18}$ cm$^{-3}$ and made of an n-type GaAs layer; and a 100-nm-thick emitter contact layer 107, for example, doped with n-type impurities at a high concentration of $1 \times 10^{19}$ cm$^{-3}$ and made of a 100-nm-thick n-type InGaAs layer. In other words, the emitter layer 105, the emitter cap layer 106, and the emitter contact layer 107 are formed on the predetermined part of the base layer 104 to have a convex shape. In this relation, In$_{0.48}$Ga$_{0.52}$P constituting the emitter layer 105 has a larger band gap than GaAs constituting the base layer 104. InGaAs constituting the emitter contact layer 107 has a smaller band gap than GaAs constituting the emitter cap layer 106.

An emitter electrode 111, for example, having a Pt/Ti/Pt/Au structure is formed on the emitter contact layer 107. A base electrode 112, for example, having a Pt/Ti/Pt/Au structure is formed on an exposed part of the base layer 104 on which the emitter layer 105 is not formed. A collector electrode 113, for example, having a Pt/Ti/Pt/Au structure is formed on an exposed part of the second subcollector layer 108 on which the collector layer 103 is not formed.

A first Pt alloying reaction layer 114 is formed in a part of the emitter contact layer 107 located under the emitter electrode 111. In this relation, the first Pt alloying reaction layer 114 is formed by heat treatment for reacting Pt constituting the lowest layer of the emitter electrode 111 with InGaP constituting the emitter contact layer 107. In addition, the first Pt alloying reaction layer 114 is formed only inside the emitter contact layer 107.

A second Pt alloying reaction layer 115 is formed in a part of the base layer 104 located under the base electrode 112. In this relation, the second Pt alloying reaction layer 115 is formed by heat treatment for reacting Pt constituting the lowest layer of the base electrode 112 with GaAs constituting the base layer 104. In addition, the second Pt alloying reaction layer 115 is formed only inside the base layer 104.

A third Pt alloying reaction layer 116 is formed in a part of the second subcollector layer 108 located under the collector electrode 113. In this relation, the third Pt alloying reaction layer 116 is formed by heat treatment for reacting Pt constituting the lowest layer of the collector electrode 113 with InGaAs constituting the second subcollector layer 108. In addition, the third Pt alloying reaction layer 116 is formed only inside the second subcollector layer 108.

In this embodiment, in order to electrically isolate HBTs from one another, an isolation region 141 is formed around each HBT formation region to pass through a multilayer structure of the second subcollector layer 108 and the first subcollector 102 and reach the substrate 101.

A method for fabricating a HBT of this embodiment as shown in FIG. 4 will be described hereinafter with reference to the drawings.

FIGS. 5A through 5C, 6A, and 6B are cross-sectional views showing process steps of the method for fabricating a HBT of this embodiment.

Figure 5A:
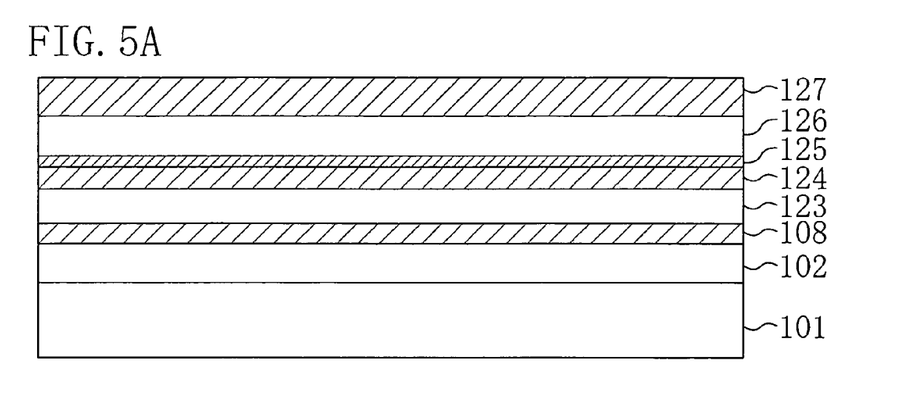
FIGS. 5A through 5C are cross-sectional views showing some of process steps of a method for fabricating a HBT according to the second embodiment of the present invention.

First, as shown in FIG. 5A, the following layers are successively formed on a semi-insulating substrate 101, for example, made of GaAs by crystal growth, such as MBE or MOCVD: a 600-nm-thick first subcollector layer 102, for example, doped with n-type impurities at a high concentration of $5 \times 10^{18}$ cm$^{-3}$ and made of an n-type GaAs layer; a 100-nm-thick second subcollector layer 108, for example, doped with n-type impurities at a high concentration of $1 \times 10^{19}$ cm$^{-3}$ and made of an n-type InGaAs layer; a 500-nm-thick collector-layer-forming film 123, for example, doped with n-type impurities at a low concentration of $1 \times 10^{16}$ cm$^{-3}$ and made of an n-type GaAs layer; a 100-nm-thick base-layer-forming film 124, for example, doped with p-type impurities at a high concentration of $4 \times 10^{19}$ cm$^{-3}$ and made of a p-type GaAs layer; a 30-nm-thick emitter-layer-forming film 125, for example, doped with n-type impurities at a concentration of $3 \times 10^{17}$ cm$^{-3}$ and made of an n-type InGaP (specifically, $In_{0.48}Ga_{0.52}P$ having an In content of about 48%) layer; a 200-nm-thick emitter-cap-layer-forming film 126, for example, doped with n-type impurities at a high concentration of $3 \times 10^{18}$ cm$^{-3}$ and made of an n-type GaAs layer; and a 100-nm-thick emitter-contact-layer-forming film 127, for example, doped with n-type impurities at a high concentration of $1 \times 10^{19}$ cm$^{-3}$ and made of an n-type InGaAs layer. An i-type GaAs layer may be formed as the collector-layer-forming film 123. Furthermore, $In_{0.48}Ga_{0.52}P$ constituting the emitter-layer-forming film 125 has a larger band gap than GaAs constituting the base-layer-forming film 124. InGaAs constituting the emitter-contact-layer-forming film 127 has a smaller band gap than GaAs constituting the emitter-cap-layer-forming film 126.

Figure 5B:
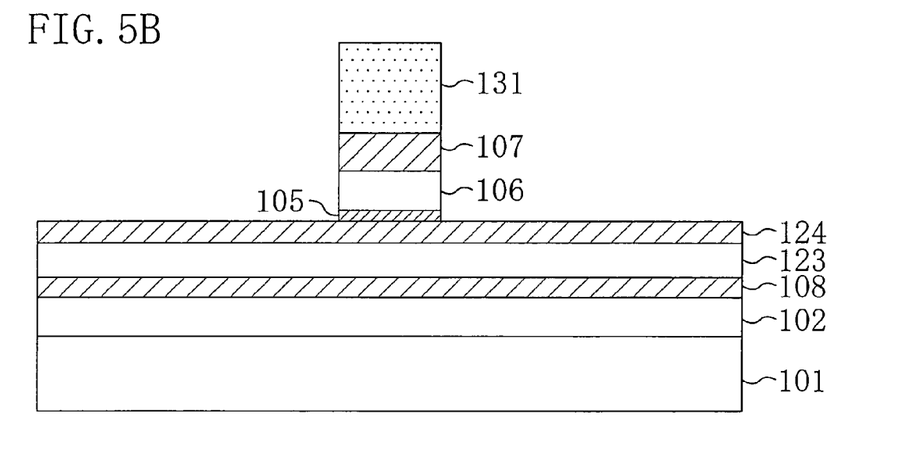

Next, as shown in FIG. 5B, the emitter-contact-layer-forming film 127 and the emitter-cap-layer-forming film 126 are successively etched, for example, by a phosphate etching solution, using, as a mask, a photo resist pattern 131 for protecting an emitter formation region. Subsequently, the emitter-layer-forming film 125 is selectively etched, for example, by hydrochloric acid diluted with water, using a photo resist pattern 131 as a mask. In this way, an emitter island region having a multilayer structure of an emitter layer 105, an emitter cap layer 106, and an emitter contact layer 107 is formed. In addition, a base electrode formation region of the base-layer-forming film 124 is exposed. In this case, the base-layer-forming film 124 made of a GaAs layer is hardly etched.

Figure 5C:
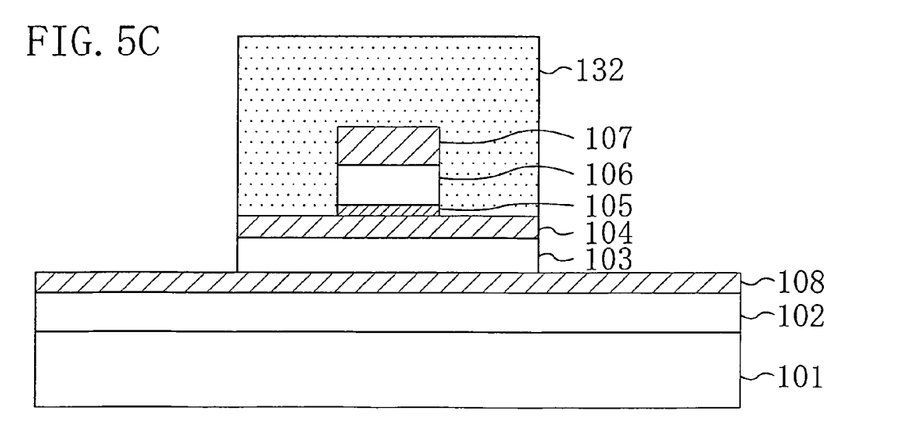

Next, as shown in FIG. 5C, the base-layer-forming film 124 and the collector-layer-forming film 123 are successively etched, for example, by a citrate etching solution, using, as a mask, a photo resist pattern 132 for protecting a base formation region including the emitter formation region. In this way, a base island region having a multilayer structure of a collector layer 103 and a base layer 104 is formed. In addition, a collector electrode formation region of the second subcollector layer 108 is exposed. In this case, the second subcollector layer 108 of InGaAs is hardly etched. In this embodiment, the second subcollector layer 108 made of an InGaAs layer functions as an etching stopper layer for wet etching using a citrate etching solution. Therefore, as compared with the known art, etching accuracy can sharply be improved in forming the base island region.

Figure 6A:
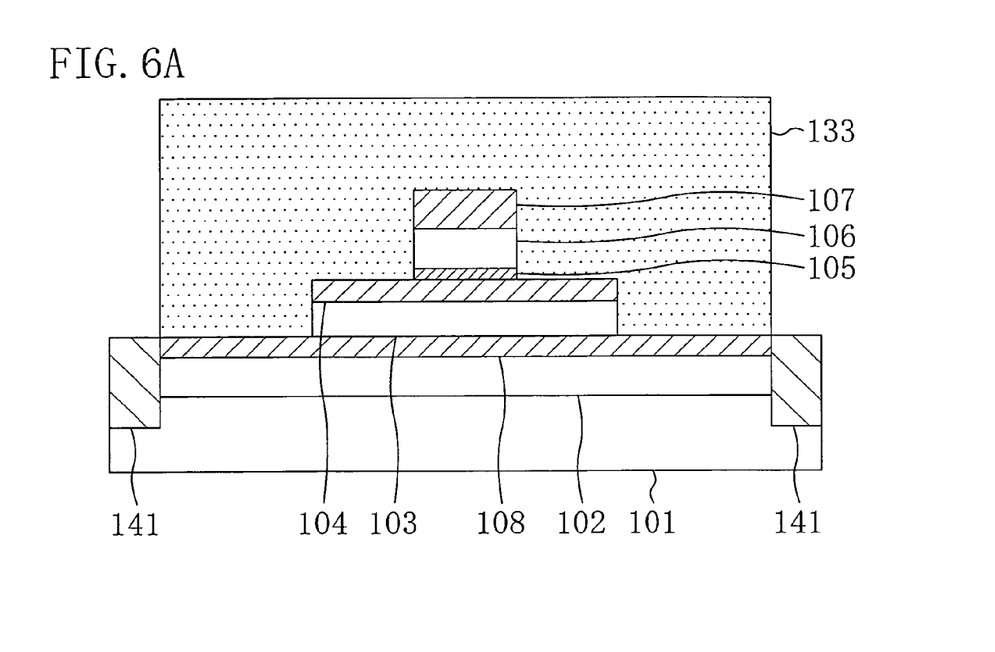
FIGS. 6A and 6B are cross-sectional views showing some of process steps of a method for fabricating a HBT according to the second embodiment of the present invention.

Next, as shown in FIG. 6A, for example, helium (He) ions are implanted into the second subcollector layer 108 and the first subcollector layer 102 using, as a mask, a photo resist pattern 133 for protecting each of unit HBT cells (individual HBT formation regions), thereby forming an isolation region 141. In this way, the unit HBT cells are isolated from one another.

Figure 6B:
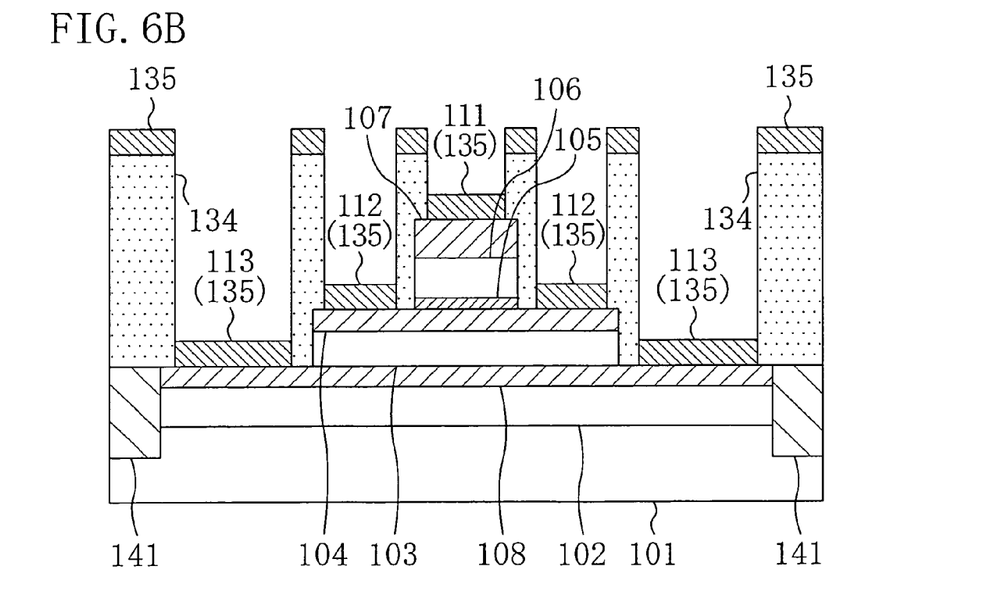

Next, as shown in FIG. 6B, a photo resist pattern 134 for forming electrodes, more specifically, the photo resist pattern 134 is formed to have openings on an emitter electrode formation region, a base electrode formation region and a collector electrode formation region. Thereafter, an electrode-forming film 135, for example, having a Pt/Ti/Pt/Au structure (more specifically, the structure in which a 30-nm-thick Pt film, a 100-nm-thick Ti film, a 50-nm-thick Pt film, and a 50-nm-thick Au film are successively stacked) is formed on the entire surface region of the substrate, for example, by evaporation. Then, for example, the use of a lift-off technique allows unnecessary parts of the electrode-forming film 135 to peel off together with the photo resist pattern 134. In this way, an emitter electrode 111 is formed on the emitter electrode formation region of the emitter contact layer 107, a base electrode 112 is formed on the base electrode formation region of the base layer 104, and a collector electrode 113 is formed on the collector electrode formation region of the second subcollector layer 108. In other words, in this embodiment, the emitter electrode 111, the base electrode 112 and the collector electrode 113 are formed at the same time.

Finally, in order to complete the HBT of this embodiment shown in FIG. 4, for example, heat treatment at 390° C. for 120 seconds allows a metal (more specifically, Pt) constituting each electrode to react with a component of a semiconductor layer under each electrode. In this way, a first Pt alloying reaction layer 114 is formed in a part of the emitter contact layer 107 located under the emitter electrode 111, a second Pt alloying reaction layer 115 is formed in a part of the base layer 104 located under the base electrode 112, and a third Pt alloying reaction layer 116 is formed in a part of the second subcollector layer 108 located under the collector electrode 113. The first Pt alloying reaction layer 114 is formed only inside the emitter contact layer 107, the second Pt alloying reaction layer 115 is formed only inside the base layer 104, and the third Pt alloying reaction layer 116 is formed only inside the second subcollector layer 108. Furthermore, in this embodiment, heat treatment is performed for the purpose of forming the Pt alloying reaction layers 114 through 116 and simultaneously inactivating the isolation region (formed by ion implantation) 141 to electrically isolate the unit HBT cells from one another. As a result, the number of fabrication process steps is reduced.

Although in this embodiment a part of the emitter-layer-forming film 125 located outside the emitter formation region is entirely removed (see FIG. 5B), a part of the emitter-layer-forming film 125 located outside a base formation region and in the base electrode formation region may be removed instead. Thus, in the HBT of this embodiment shown in FIG. 4, parts of the base layer 104 located outside the base electrode formation region can be covered with the emitter layer 105 while the base electrode 112 is placed directly on a part of the base layer 104 located in the base electrode formation region.

As described above, in this embodiment, heavily-doped n-type semiconductors made of a material having a small band gap are used for the emitter contact layer 107 and the second subcollector layer 108. Therefore, ohmic connection between the emitter contact layer 107 and a metal constituting the emitter electrode 111 formed thereon can easily be realized, and ohmic connection between the second subcollector layer 108 and a metal constituting the collector electrode 113 formed thereon can also easily be realized. Therefore, the same material as that of the base electrode 112 can be used as a material of each of the emitter electrode 111 and the collector electrode 113, and thus the electrodes 111 through 113 can be formed at the same time. This can reduce the number of fabrication process steps, leading to the reduced production cost.

According to this embodiment, the emitter electrode 111, the base electrode 112 and the collector electrode 113 are all made of the same material. In other words, the electrodes 111 through 113 each have the same metal multilayer structure. Therefore, the same optimum heat treatment conditions can be set to form the alloying reaction layers 114 through 116 under the electrode 111 through 113, respectively. To be specific, the following optimum heat treatment conditions are made equivalent to one another: the optimum heat treatment conditions for forming the first alloying reaction layer 114 under the emitter electrode 111; the optimum heat treatment conditions for forming the second alloying reaction layer 115 under the base electrode 112; and the optimum heat treatment conditions for forming the third alloying reaction layer 116 under the collector electrode 113. Hence, all the electrodes 111 through 113 can provide excellent ohmic contact.

It is needless to say that in the first or second embodiment the impurity concentration, thickness and composition of each of the semiconductor layers constituting the HBT are not restrictive to the above-mentioned values.

In the first or second embodiment, a Pt layer is used as the lowest layer of each of the emitter electrode 111, the base electrode 112 and the collector electrode 113. Also if, for example, a Pd layer or a Ni layer is alternatively used, an alloying reaction layer is formed below each electrode. This provides the similar effects as those of this embodiment. The emitter electrode 111, the base electrode 112 and the collector electrode 113 may have a single layer structure made of Pt, Pd or Ni.

Although in the first or second embodiment the isolation region is formed by ion implantation, a trench serving as an isolation region may be formed instead, for example, by wet etching.

Although in the first or second embodiment an InGaP layer is used as the emitter layer 105, for example, an AlGaAs layer may be used instead.

Although in the first or second embodiment an InGaAs layer is used as the second subcollector layer 108 and the emitter contact layer 107, the layers 108 and 107 may alternatively have a semiconductor multilayer structure containing an InGaAs layer.

The first and second embodiment cover a HBT using a GaAs substrate as the semi-insulating substrate 101. It is needless to say that also if the first or second embodiment alternatively covers a HBT using an InP substrate as the semi-insulating substrate 101 and an InP layer, an InAlAs layer or the like as the emitter layer 105, this provides the same effects.

What is claimed is:

1. A method for fabricating a heterojunction bipolar transistor, comprising the steps of:

successively forming, on the principal surface of a semi-insulating substrate, a heavily-doped n-type first subcollector layer, a heavily-doped n-type second subcollector layer made of a material having a smaller band gap than the first subcollector layer, an i-type or a lightly-doped n-type collector-layer-forming film, a heavily-doped p-type base-layer-forming film, an n-type emitter-layer-forming film made of a material having a larger band gap than the base-layer-forming film, a heavily-doped n-type emitter-cap-layer-forming film, and a heavily-doped n-type emitter-contact-layer-forming film made of a material having a smaller band gap than the emitter-cap-layer-forming film;

patterning the emitter-contact-layer-forming film and the emitter-cap-layer-forming film to expose a base electrode formation region of the emitter-layer-forming film, thereby forming an emitter contact layer and an emitter cap layer;

patterning the emitter-layer-forming film, the base-layer-forming film and the collector-layer-forming film to expose a collector electrode formation region of the second subcollector layer, thereby forming an emitter layer, a base layer and a collector layer;

forming an emitter electrode made of one or a plurality of conductive layers on an emitter electrode formation region of the emitter contact layer;

forming a base electrode made of one or a plurality of conductive layers on the base electrode formation region of the emitter layer;

forming a collector electrode made of one or a plurality of conductive layers on the collector electrode formation region of the second subcollector layer; and forming, by heat treatment, a first alloying reaction layer, a second alloying reaction layer and a third alloying reaction layer in a part of the emitter contact layer located under the emitter electrode, a part of the emitter layer located under the base electrode and a part of the second subcollector layer located under the collector electrode, respectively.

2. The method for fabricating a heterojunction bipolar transistor of claim 1, wherein the semi-insulating substrate is a GaAs substrate or an InP substrate.

3. The method for fabricating a heterojunction bipolar transistor of claim 1, wherein
the step of forming the emitter electrode, the step of forming the base electrode and the step of forming the collector electrode are carried out at the same time.

4. The method for fabricating a heterojunction bipolar transistor of claim 1, wherein
a conductive layer constituting the lowest layer of the emitter electrode, a conductive layer constituting the lowest layer of the base electrode and a conductive layer constituting the lowest layer of the collector electrode are all made of Pt, Pd or Ni.

5. The method for fabricating a heterojunction bipolar transistor of claim 1, further comprising the step of implanting ions into regions of both the second subcollector layer and the first subcollector layer other than element formation regions thereof to form an isolation region,
wherein the isolation region into which the ions are implanted is inactivated simultaneously with the heat treatment in the step of forming each said alloying reaction layer.

6. A method for fabricating a heterojunction bipolar transistor, said method comprising the steps of:
successively forming, on the principal surface of a semi-insulating substrate, a heavily-doped n-type first subcollector layer, a heavily-doped n-type second subcollector layer made of a material having a smaller band gap than the first subcollector layer, an i-type or a lightly-doped n-type collector-layer-forming film, a heavily-doped p-type base-layer-forming film, an n-type emitter-layer-forming film made of a material having a larger band gap than the base-layer-forming film, a heavily-doped n-type emitter-cap-layer-forming film, and a heavily-doped n-type emitter-contact-layer-forming film made of a material having a smaller band gap than the emitter-cap-layer-forming film;
patterning the emitter-contact-layer-forming film, the emitter-cap-layer-forming film and the emitter-layer-forming film to expose a base electrode formation region of the base-layer-forming film, thereby forming an emitter contact layer, an emitter cap layer and an emitter layer;
patterning the base-layer-forming film and the collector-layer-forming film to expose a collector electrode formation region of the second subcollector layer, thereby forming a base layer and a collector layer;
forming an emitter electrode made of one or a plurality of conductive layers on an emitter electrode formation region of the emitter contact layer;
forming a base electrode made of one or a plurality of conductive layers on the base electrode formation region of the base layer;
forming a collector electrode made of one or a plurality of conductive layers on the collector electrode formation region of the second subcollector layer; and
forming, by heat treatment, a first alloying reaction layer, a second alloying reaction layer and a third alloying reaction layer in a part of the emitter contact layer located under the emitter electrode, a part of the base layer located under the base electrode and a part of the second subcollector layer located under the collector electrode, respectively.

7. The method for fabricating a heterojunction bipolar transistor of claim 6, wherein
the semi-insulating substrate is a GaAs substrate or an InP substrate.

8. The method for fabricating a heterojunction bipolar transistor of claim 6, wherein
the step of forming the emitter electrode, the step of forming the base electrode and the step of forming the collector electrode are carried out at the same time.

9. The method for fabricating a heterojunction bipolar transistor of claim 6, wherein
a conductive layer constituting the lowest layer of the emitter electrode, a conductive layer constituting the lowest layer of the base electrode and a conductive layer constituting the lowest layer of the collector electrode are all made of Pt, Pd or Ni.

10. The method for fabricating a heterojunction bipolar transistor of claim 6, further comprising the step of implanting ions into regions of both the second subcollector layer and the first subcollector layer other than element formation regions thereof to form an isolation region,
wherein the isolation region into which the ions are implanted is inactivated simultaneously with the heat treatment in the step of forming each said alloying reaction layer.

* * * * *